(12) United States Patent
Parks et al.

(10) Patent No.: US 9,995,768 B2
(45) Date of Patent: Jun. 12, 2018

(54) INTERCONNECTION METER SOCKET ADAPTERS

(71) Applicant: San Diego Gas & Electric Company, San Diego, CA (US)

(72) Inventors: Ken Parks, San Diego, CA (US); Michael Colburn, San Diego, CA (US)

(73) Assignee: San Diego Gas & Electric, San Diego, CA (US)

( * ) Notice: Subject to any disclaimer, the term of this patent is extended or adjusted under 35 U.S.C. 154(b) by 390 days.

(21) Appl. No.: 14/472,269

(22) Filed: Aug. 28, 2014

(65) Prior Publication Data

US 2015/0061644 A1    Mar. 5, 2015

Related U.S. Application Data

(60) Provisional application No. 61/871,090, filed on Aug. 28, 2013.

(51) Int. Cl.
| | | |
|---|---|---|
| *G01R 1/04* | (2006.01) |
| *H01R 33/94* | (2006.01) |
| *G01R 3/00* | (2006.01) |
| *H02B 1/03* | (2006.01) |
| *G01R 11/04* | (2006.01) |

(52) U.S. Cl.
CPC ............. *G01R 1/0416* (2013.01); *G01R 3/00* (2013.01); *H01R 33/94* (2013.01); *G01R 11/04* (2013.01); *H02B 1/03* (2013.01); *Y10T 29/49208* (2015.01)

(58) Field of Classification Search
CPC ........ G01R 1/0416; G01R 3/00; G01R 11/04; H01R 33/94; H02B 1/03; Y10T 29/49208

USPC ................. 361/664–666, 668–670; 439/517
See application file for complete search history.

(56) References Cited

U.S. PATENT DOCUMENTS

| | | |
|---|---|---|
| 4,977,482 A | 12/1990 | Langdon et al. |
| 5,572,396 A | 11/1996 | Robinson |
| 5,834,932 A | 11/1998 | May |
| 5,894,422 A | 4/1999 | Chasek |
| 6,112,158 A | 8/2000 | Bond et al. |
| 6,188,145 B1* | 2/2001 | Stewart ................. G01R 11/02 307/125 |

(Continued)

OTHER PUBLICATIONS

Patent Cooperation Treaty, International Search Report for PCT/US2016/041612, dated Dec. 2, 2016, pp. 1-4.

*Primary Examiner* — Zachary M Pape
(74) *Attorney, Agent, or Firm* — Sheppard Mullin Richter & Hampton

(57) ABSTRACT

Interconnection meter socket adapters are provided. An interconnection meter socket adapter comprises a housing enclosing a set of electrical connections. The interconnection meter socket adapter may be configured to be coupled to a standard distribution panel and a standard electrical meter, thereby establishing connections between a distribution panel and a user such that electrical power may be delivered to the user while an electrical meter measures the power consumption of the user. An interconnection meter socket adapter may be configured to be coupled to a DC-AC converter, which may be coupled to various energy sources. As such, the energy sources are coupled to an electrical power system. In addition, a connector such as a flexible cable or flexible conduit containing insulated wires can be provided for connecting various energy sources and/or sinks.

19 Claims, 3 Drawing Sheets

(56) References Cited

U.S. PATENT DOCUMENTS

| | | |
|---|---|---|
| 7,540,767 B1 | 6/2009 | Czarnecki |
| 7,648,389 B1 * | 1/2010 | Scott .................. H01R 9/2491 439/517 |
| 7,994,934 B2 | 8/2011 | Kagan |
| 8,368,386 B2 | 2/2013 | Reineccius |
| 8,784,130 B2 * | 7/2014 | Scott .................. H01R 33/945 439/517 |
| 8,855,019 B2 | 10/2014 | Elliott et al. |
| 9,047,074 B2 | 6/2015 | Pfeifer et al. |
| 9,500,672 B1 * | 11/2016 | Bautista ................ G01R 1/0416 |
| 2002/0171436 A1 | 11/2002 | Russell |
| 2005/0027464 A1 | 2/2005 | Jonker et al. |
| 2005/0194962 A1 | 9/2005 | Briese et al. |
| 2009/0091291 A1 | 4/2009 | Woody et al. |
| 2009/0108680 A1 | 4/2009 | Minemura |
| 2009/0124119 A1 | 5/2009 | Austin |
| 2010/0003848 A1 * | 1/2010 | Scott .................. H01R 9/2491 439/517 |
| 2010/0128418 A1 | 5/2010 | Pruehs et al. |
| 2010/0225305 A1 * | 9/2010 | Reineccius ............ G01R 22/06 324/126 |
| 2011/0001356 A1 * | 1/2011 | Pollack ............... B60L 11/1842 307/31 |
| 2011/0010043 A1 | 1/2011 | Lafky |
| 2011/0040785 A1 | 2/2011 | Steenberg et al. |
| 2011/0212648 A1 | 9/2011 | Fish |
| 2011/0237118 A1 | 9/2011 | Feldman et al. |
| 2011/0248858 A1 | 10/2011 | Onodi et al. |
| 2012/0023039 A1 * | 1/2012 | Kremen ................ G06Q 40/02 705/36 T |
| 2012/0097045 A1 | 4/2012 | Kurimoto et al. |
| 2012/0191387 A1 | 7/2012 | Yamanaka et al. |
| 2012/0229082 A1 | 9/2012 | Vukojevic et al. |
| 2012/0276775 A1 | 11/2012 | Garwood et al. |
| 2013/0020991 A1 | 1/2013 | Deboer et al. |
| 2013/0026986 A1 | 1/2013 | Parthasarathy et al. |
| 2013/0086253 A1 | 4/2013 | Cutler et al. |
| 2013/0110296 A1 | 5/2013 | Khoo et al. |
| 2014/0098470 A1 | 4/2014 | Robinson et al. |
| 2014/0127935 A1 * | 5/2014 | Scott .................. H01R 33/945 439/517 |
| 2014/0218010 A1 | 8/2014 | Fulton et al. |
| 2014/0312841 A1 | 10/2014 | Baba |
| 2015/0061644 A1 * | 3/2015 | Parks .................. H01R 33/94 324/126 |
| 2015/0162157 A1 | 6/2015 | Luebke et al. |
| 2015/0309075 A1 * | 10/2015 | Parks .................. G01R 1/0416 324/126 |
| 2016/0181752 A1 * | 6/2016 | Parks .................... B60R 16/02 439/517 |
| 2016/0232623 A1 * | 8/2016 | Parks .................... B60R 16/02 |
| 2016/0236634 A1 * | 8/2016 | Parks .................... G05F 1/66 |
| 2016/0238633 A1 * | 8/2016 | Parks .................... G05F 1/66 |
| 2016/0239035 A1 * | 8/2016 | Parks .................... B60R 16/02 |
| 2016/0247241 A1 * | 8/2016 | Parks .................... B60R 16/02 |
| 2016/0247242 A1 * | 8/2016 | Parks .................... B60R 16/02 |

* cited by examiner

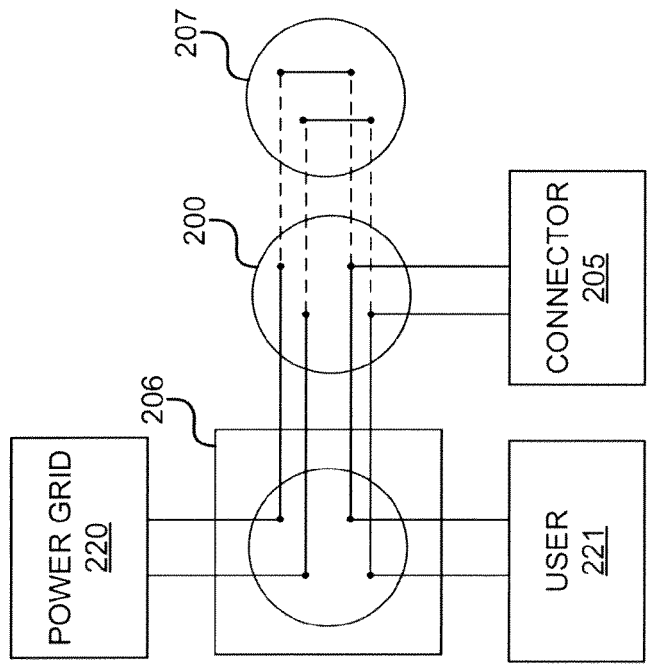
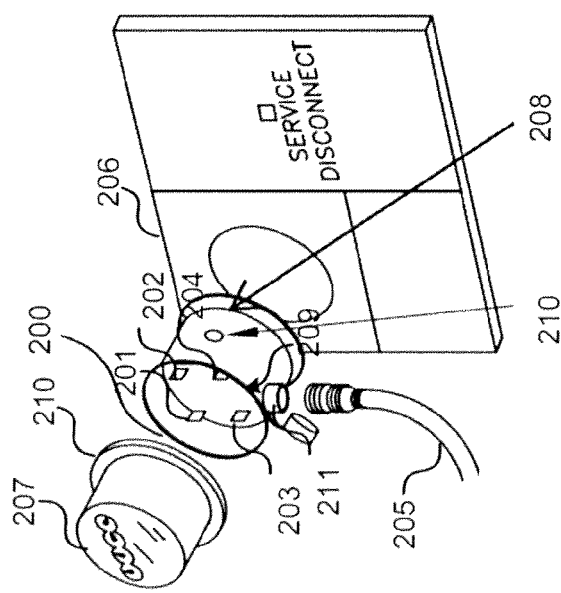
FIG. 2B
FIG. 2A sources of the invention,
INTERCONNECTION METER SOCKET ADAPTERS

RELATED APPLICATIONS

This application claims priority to U.S. Provisional Patent Application No. 61/871,090 filed on Aug. 28, 2013, the content of which is incorporated herein by reference in its entirety.

TECHNICAL FIELD

The present invention relates generally to electrical components, and more particularly, some embodiments relate to interconnection meter socket adapters for connecting various energy sources and sinks to a power system without changing an existing distribution panel.

DESCRIPTION OF THE RELATED ART

A distribution panel is the hub where an electrical power feed is divided into subsidiary circuits. Typically, distribution panels of different capacities (e.g., 150-amp, 200-amp, or 400-amp) are installed to homes depending on their electrical usage needs. Power carried by the electrical power feed is distributed to the users via the distribution panel. Therefore, an increased load that results in more electrical currents flowing through the distribution panel may require changing an existing distribution panel to accommodate the current change. Furthermore, with the emergence of renewable energy sources, a user that traditionally consumes electrical power may provide electrical power into a distribution grid at certain times. This back feed of energy may exceed the current capacity of an existing distribution panel, requiring the existing distribution panel to be changed.

In many cases, there is no room in the distribution panel for more circuits. A distribution panel is usually limited to a certain amount of electrical circuits. New circuits may be added if there are unused locations in the existing distribution panel; otherwise, the existing distribution panel needs to be replaced by a distribution panel with a larger capacity.

BRIEF SUMMARY OF THE INVENTION

Interconnection meter socket adapters are provided. Various embodiments of the invention may be under utility seal and ownership. Customer wiring behind the meter is avoided, which allows a utility company to own the connection all the way up to the disconnecting means. In one embodiment, an interconnection meter socket adapter comprises a housing enclosing a set of electrical connections. The interconnection meter socket adapter may be configured to be coupled to a standard distribution panel and a standard electrical meter. Various embodiments may establish connections between a distribution panel and a user such that electrical power may be delivered to the user while an electrical meter will still measure the power consumption of the user.

In addition, various embodiments are configured to be coupled to a DC-AC converter, which may be coupled to various energy sources. As such, the energy sources are coupled to an electrical power system. In some embodiments, a connector such as a flexible cable (e.g., six feet) or flexible conduit containing insulated wires may be provided. Therefore, an interconnection meter socket adapter may be installed far enough away from a gas riser thereby meeting service standards. Further embodiments may comprise a measurement module for monitoring the bi-directional power flow through an interconnection meter socket adapter. That is, the power consumption of the user and/or an energy sink as well as the energy generation of an energy source may be monitored. The real-time data may be provided by a communication module and used for electrical power system planning purposes.

Other features and aspects of the invention will become apparent from the following detailed description, taken in conjunction with the accompanying drawings, which illustrate, by way of example, the features in accordance with embodiments of the invention. The summary is not intended to limit the scope of the invention, which is defined solely by the claims attached hereto.

BRIEF DESCRIPTION OF THE DRAWINGS

The present invention, in accordance with one or more various embodiments, is described in detail with reference to the following figures. The drawings are provided for purposes of illustration only and merely depict typical or example embodiments of the invention. These drawings are provided to facilitate the reader's understanding of the invention and shall not be considered limiting of the breadth, scope, or applicability of the invention. It should be noted that for clarity and ease of illustration these drawings are not necessarily made to scale.

FIG. 2A illustrates an exemplary interconnection meter socket adapter in accordance with an embodiment.

FIG. 2B illustrates an exemplary circuit diagram of an interconnection meter socket adapter in accordance with an embodiment.

The figures are not intended to be exhaustive or to limit the invention to the precise form disclosed. It should be understood that the invention can be practiced with modification and alteration, and that the invention be limited only by the claims and the equivalents thereof.

DETAILED DESCRIPTION OF THE INVENTION

Conventionally, when introducing renewable energy such as solar energy, fuel cells, wind energy, and geothermal energy, a DC-AC inverter is needed to convert the output of a renewable energy source to AC energy so that the energy source may be coupled to an electrical power system. This may cause a large amount of current back fed into a distribution power grid, which may require an existing distribution panel to be changed. Some existing technologies such as hard wired adapters are not allowed in many utility service areas as they do not meet service standards due to customer wiring behind the meter. There are also constraints and requirements related to gas meter sets that limit the use of adapters. In addition, these hard wired adapters require a professional, qualified electrician for removal or installation, and also lack the ability to monitor bi-directional power flow real time. Only the net amount between generation and consumption is measured.

Interconnection meter socket adapters are provided. Various embodiments may be under utility seal and ownership.

Customer wiring behind the meter is avoided, which allows a utility company to own the connection all the way up to the disconnecting means. In one embodiment, an interconnection meter socket adapter comprises a housing enclosing a set of electrical connections. The interconnection meter socket adapter may be configured to be coupled to a standard distribution panel and a standard electrical meter. Various embodiments may establish connections between a distribution panel and a user such that electrical power may be delivered to the user while an electrical meter may still measure the power consumption of the user.

In addition, various embodiments are configured to be coupled to a DC-AC converter, which may be coupled to various energy sources. As such, the energy sources are coupled to an electrical power system. In some embodiments, a connector such as a flexible cable (e.g., six feet) or flexible conduit containing insulated wires may be provided. Therefore, an interconnection meter socket adapter may be installed far enough away from a gas riser thereby meeting service standards. Further embodiments may comprise a measurement module for monitoring the bi-directional power flow through an interconnection meter socket adapter. That is, the power consumption of the user and/or an energy sink as well as the energy generation of an energy source may be monitored. The real-time data may be provided by a communication module and used for electrical power system planning purposes.

Figure 1:
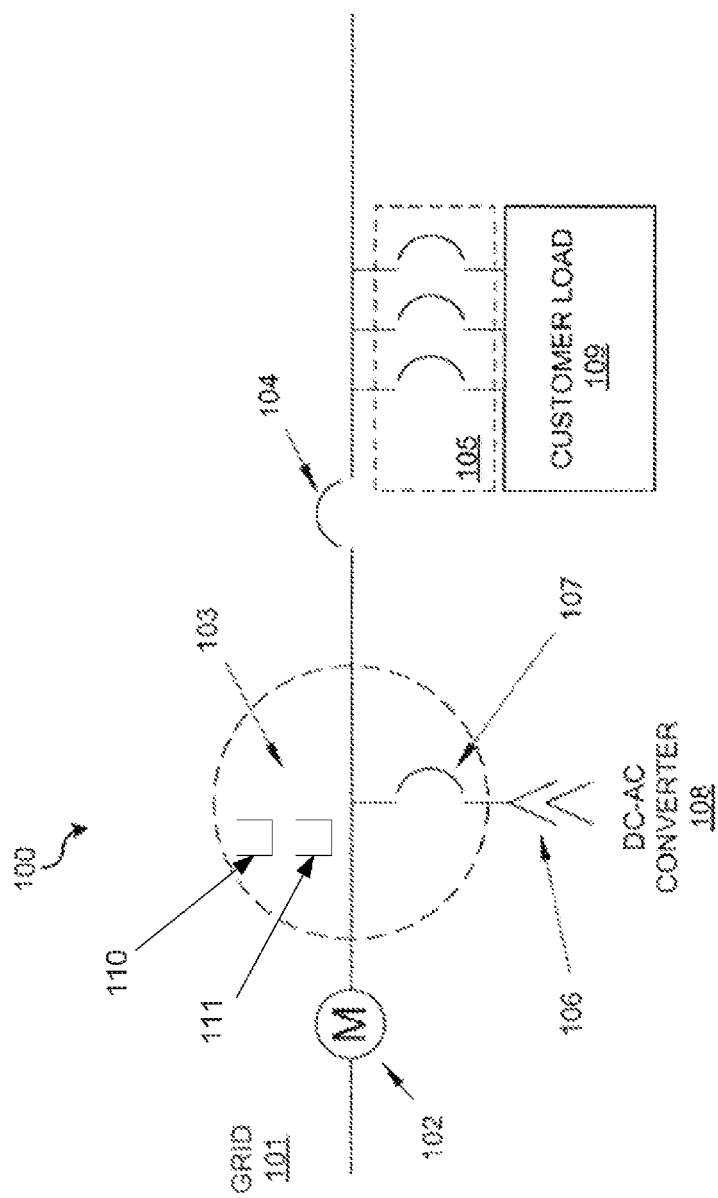
FIG. 1 illustrates a one-line diagram illustrating an exemplary installation of an interconnection meter socket adapter, in accordance with an embodiment of the application.

FIG. 1 illustrates a one-line diagram illustrating an exemplary installation 100 of an interconnection meter socket adapter 103, in accordance with an embodiment of the application. In the illustrated example, a customer 109 is coupled to a power system distribution grid 101. As illustrated, the interconnection meter socket adapter 103 is installed between the utility revenue meter 102 and an existing customer main breaker 104. The interconnection meter socket adapter 103 may allow the energy source and the energy sink to connect to the power grid 101 without updating the distribution panel.

The interconnection meter socket adapter 103 electrically bypasses the entire breaker and buswork section of a distribution panel. The interconnection meter socket adapter 103 is physically installed between existing main breaker 104 and the utility revenue meter 102. In various embodiments, the interconnection meter socket adapter 103 is cylindrical. An interconnection meter socket adapter 103 may mimic the connector arrangement of a revenue meter on one side, and the connector arrangement of the customer main panel on the other side. The interconnection meter socket adapter 103 may be installed under utility seals. The interconnection meter socket adapter 103 comprises a buswork internal to the cylinder that couples the customer load 109 to a tap on the load side of the revenue meter 102. Continuous connectivity is thereby maintained between the grid 101 and the customer's permanent main breaker 104 and the branch circuits 105.

The interconnection meter socket adapter 103 may provide a separable connector 106. The connector 106 may include a flexible cable or flexible conduit containing insulated wires. The separable connector 106 couple the energy source and/or the energy sink to the power grid 101. A DC-AC converter 108 is coupled to an energy source (e.g., solar energy, wind energy, or full cells) (not shown) and the separable connector 106, which is coupled to the interconnection meter socket adapter 103. By converting the DC energy generated by the energy source into AC energy, the DC-AC converter 108 injects power flow into the power grid 101. In some embodiments, the separable connector 106 may also be coupled to an energy sink (e.g., an electric vehicle.) In some embodiments, an interconnection meter socket adapter 103 may comprise a breaker 107, which is coupled to the separable connector 106. The breaker 107 may be a resettable over current breaker protection device. The breaker 107 may be sized appropriately according to the National Electric Code.

In further embodiments, an interconnection meter socket adapter 103 may comprise a measurement module 110 and a communication module 111. The communication module 111 may be coupled to the measurement module 110. The measurement module 110 may monitor the bidirectional power flow through the interconnection meter socket adapter 103. The measurement may be provided to a customer and/or a utility company for load and/or generation monitor. The communication module 110 may provide the measurement to a data collection device.

FIG. 2A-2B illustrate an exemplary interconnection meter socket adapter as well as its circuit diagram in accordance with an embodiment. FIG. 2A illustrates an exemplary interconnection meter socket adapter 200 in accordance with an embodiment. The interconnection meter socket adapter 200 may be installed physically between a meter 207 and a distribution panel 206. By way of example, the meter 207 may be a standard electricity meter that is either analog or digital. The meter 207 may be installed (e.g., plugged into) the distribution panel 206 directly. The interconnection meter socket adapter 200 may establish physical connectivity between the distribution panel 206, the meter 207, and a customer, such that the customer side of the meter 207 is tapped. During operation, the meter 207 may still measure the energy consumption of a user. In some embodiments, the meter 207 may be plugged into the interconnection meter socket adapter 200 rather than being plugged into the distribution panel 206. The interconnection meter socket adapter 200 comprises a set of jaw blades 201-204 (shown in FIG. 3B), wherein each of the jaw blades 201-204 contacts the corresponding socket in the distribution panel 206. The interconnection meter socket adapter 200 also comprises a set of sockets (shown in FIG. 3A), each socket contacting a corresponding clip, jaw blade or other contact of the meter 207.

The interconnection meter socket adapter 200 is cylindrical and comprises flanges 208-209 (shown in FIG. 2A). In the illustrated example, the flange 208 is covered by a ring, together fixing the interconnection meter socket adapter 200 to the distribution panel 206, when the meter socket adapter 200 is plugged into the distribution panel 206. The flange 209 and the ring 210 of the meter 207 fix the meter 207 to the interconnection meter socket adapter 200. In addition, the interconnection meter socket adapter 200 may include a coupler 211 to which a connector 205 may be coupled. In the illustrated example, the coupler 211 is a receptacle to the connector 205. In various embodiments, the connector 205 is a flexible cable or flexible conduit of various lengths containing insulated conductors. One end of the connector 205 is coupled to the interconnection meter socket adapter 200 and the other end is coupled to the energy source or the energy sink. As such, the energy source or an energy sink is coupled to the power grid via the interconnection meter socket adapter 200 without changing the distribution panel 206.

FIG. 2B illustrates an exemplary circuit diagram of an interconnection meter socket adapter 200. As illustrated, two phase wires (typically energized at 240 volts) couple the power grid 220 to the user 221 via a distribution panel 206. Further, the connector 205, which may be coupled to an energy source or an energy sink, is coupled to the interconnection meter socket adapter 200. By installing the interconnection meter socket adapter 200 to the distribution panel 206, the connector 205 and the user 221 are coupled in parallel, both of which may be coupled to the power grid 220. By installing the meter 207 to the interconnection meter socket adapter 200, the connector 205 and the user 221 are coupled to the power grid 220. The interconnection meter socket adapter 200 is plugged into the distribution panel 206 thereby making connections to the incoming wires from the power grid 220. In various embodiments, such connections are established by fitting a set of jaw blades of the interconnection meter socket adapter 200 into the corresponding sockets in the distribution panel 206. The utility meter 207 is plugged into the interconnection meter socket adapter 200 thereby making connections to the incoming wires from a power grid 220 and the user 221 as well as the connector 205. In various embodiments, such connections are established by fitting a set of jaw blades on meter 207 into corresponding sockets in the interconnection meter socket adapter 200.

Within the housing of the interconnection meter socket adapter 200, a set of connections are provided. When installed, the set of connections permit an energy source and/or an energy sink to be installed in parallel with an user such that no change is required in the distribution panel. In various embodiments, the connector 205 may be a flexible cable or flexible conduit containing insulated conductors serving as an interface for a solar inverter output. The solar inverter may be disconnected in case of the need for panel or meter service.

Figure 3B:
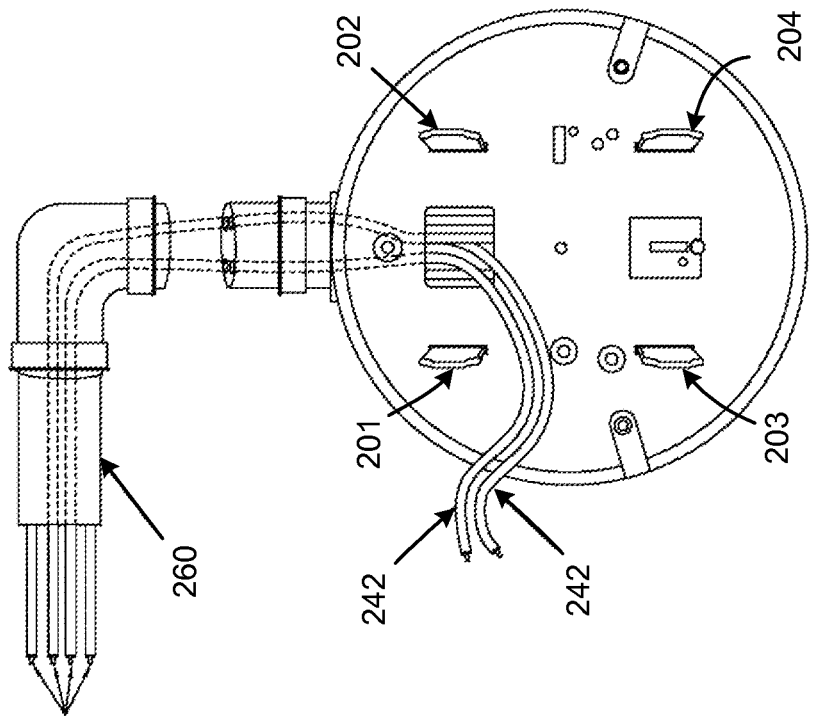
FIGS. 3A-3B are front and rear views, respectively, illustrating the electrical wiring of the interconnection meter socket adapter of FIG. 2A in accordance with an embodiment.
Figure 3A:
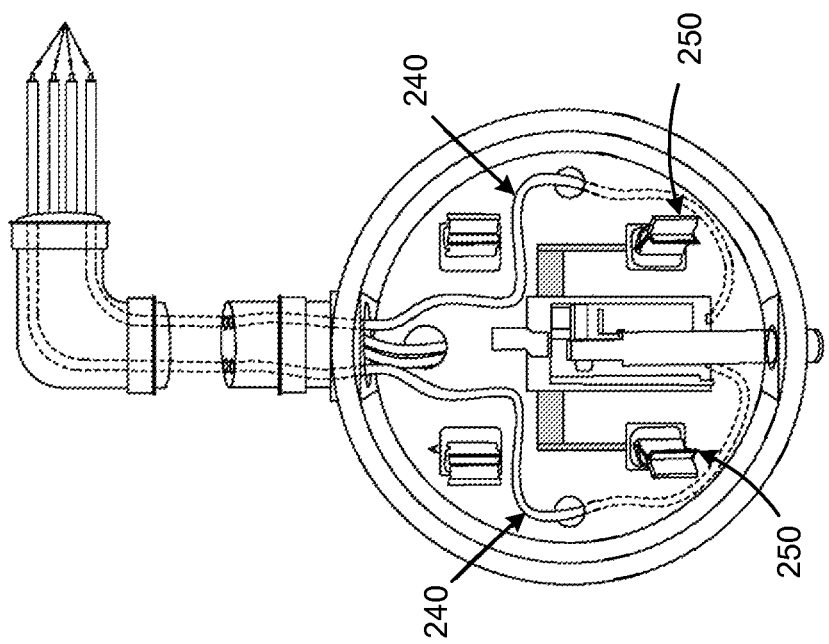

FIGS. 3A-3B are front and rear views, respectively, illustrating the electrical wiring of the interconnection meter socket adapter 200 in accordance with an embodiment. As illustrated, four wires enter the interconnection meter socket adapter 200 including two phase wires 240, a neutral wire 242, and a ground wire 244. Phase wires 240 terminate in clips 250 that connect with jaw blades 203 and 204. Typically, phase wires 240 are energized at 240V. Neutral wire 242 and ground wire 244 terminate on the customer's electrical panel ground bus. The interconnection meter socket adapter 200 can include a flexible conduit 260 that protects the wires from ambient conditions.

While various embodiments of the present invention have been described above, it should be understood that they have been presented by way of example only, and not of limitation. Likewise, the various diagrams may depict an example architectural or other configuration for the invention, which is done to aid in understanding the features and functionality that can be included in the invention. The invention is not restricted to the illustrated example architectures or configurations, but the desired features can be implemented using a variety of alternative architectures and configurations. Indeed, it will be apparent to one of skill in the art how alternative functional, logical or physical partitioning and configurations can be implemented to provide the desired features of the present invention. Also, a multitude of different constituent module names other than those depicted herein can be applied to the various partitions. Additionally, with regard to flow diagrams, operational descriptions and method claims, the order in which the steps are presented herein shall not mandate that various embodiments be implemented to perform the recited functionality in the same order unless the context dictates otherwise.

Although the invention is described above in terms of various exemplary embodiments and implementations, it should be understood that the various features, aspects and functionality described in one or more of the individual embodiments are not limited in their applicability to the particular embodiment with which they are described, but instead can be applied, alone or in various combinations, to one or more of the other embodiments of the invention, whether or not such embodiments are described and whether or not such features are presented as being a part of a described embodiment. Thus, the breadth and scope of the present invention should not be limited by any of the above-described exemplary embodiments.

Terms and phrases used in this document, and variations thereof, unless otherwise expressly stated, should be construed as open ended as opposed to limiting. As examples of the foregoing: the term "including" should be read as meaning "including, without limitation" or the like; the term "example" is used to provide exemplary instances of the item in discussion, not an exhaustive or limiting list thereof; the terms "a" or "an" should be read as meaning "at least one," "one or more" or the like; and adjectives such as "conventional," "traditional," "normal," "standard," "known" and terms of similar meaning should not be construed as limiting the item described to a given time period or to an item available as of a given time, but instead should be read to encompass conventional, traditional, normal, or standard technologies that may be available or known now or at any time in the future. Likewise, where this document refers to technologies that would be apparent or known to one of ordinary skill in the art, such technologies encompass those apparent or known to the skilled artisan now or at any time in the future.

The presence of broadening words and phrases such as "one or more," "at least," "but not limited to" or other like phrases in some instances shall not be read to mean that the narrower case is intended or required in instances where such broadening phrases may be absent. The use of the term "module" does not imply that the components or functionality described or claimed as part of the module are all configured in a common package. Indeed, any or all of the various components of a module, whether control logic or other components, can be combined in a single package or separately maintained and can further be distributed in multiple groupings or packages or across multiple locations.

Additionally, the various embodiments set forth herein are described in terms of exemplary block diagrams, flow charts and other illustrations. As will become apparent to one of ordinary skill in the art after reading this document, the illustrated embodiments and their various alternatives can be implemented without confinement to the illustrated examples. For example, block diagrams and their accompanying description should not be construed as mandating a particular architecture or configuration.

What is claimed is:

1. An interconnection meter socket adapter, comprising:
a housing enclosing a set of electrical connections, the housing configured to be coupled to a distribution panel and a meter;
the set of connections having an input portion and an output portion, wherein the set of connections couples the input portion to an input of the distribution panel and a utility side of the meter in parallel, and couples the output portion to an output of the distribution panel and a customer side of the meter in parallel;
a connector connected to an additional energy source and an energy sink; and
a measurement module measuring bidirectional power flow through the interconnection meter socket adapter, the measurement module monitoring customer power consumption and energy generation for the purpose of electrical power system planning, the measurement module further monitoring power consumption of the energy sink and energy generation of the additional energy source.

2. The interconnection meter socket adapter of claim 1, wherein the housing comprises a first flange and a second flange, the first flange covered by a ring.

3. The interconnection meter socket adapter of claim 1, wherein the housing is cylindrical.

4. The interconnection meter socket adapter of claim 1, further comprising a set of sockets configured to make contact with the meter, wherein the set of sockets are the output portion of the set of connections.

5. The interconnection meter socket adapter of claim 1, further comprising a set of jaw blades configured to make contact with the distribution panel.

6. The interconnection meter socket adapter of claim 1, wherein the housing further comprises a coupler configured to accept the connector.

7. The interconnection meter socket adapter of claim 6, further comprising a breaker coupled between the coupler and the meter.

8. The interconnection meter socket adapter of claim 6, wherein the connector includes a flexible cable or flexible conduit containing insulated wires configured to be coupled to the additional energy source and the energy sink.

9. The interconnection meter socket adapter of claim 1, further comprising a communication module coupled to the measurement module.

10. A method of connecting a renewable energy source and an energy sink and a residential customer to a power grid using a distribution panel and an interconnection meter socket adapter, comprising:
    installing an interconnection meter socket adapter coupled to the distribution panel, the interconnection meter socket adapter coupled to at least the renewable energy source during a first period and at least the energy sink during a second period, and the interconnection meter socket adapter coupled to a meter;
    measuring bidirectional power flow through the interconnection meter socket adapter, and monitoring customer power consumption and energy generation for the purpose of electrical power system planning; and
    monitoring power consumption of the energy sink and energy generation of the renewable energy source;
    wherein the interconnection meter socket adapter comprises a housing enclosing a set of electrical connections, the housing configured to be coupled to the distribution panel and the meter, the set of connections having an input portion and an output portion;
    wherein the set of connections couples the input portion to an input of the distribution panel and the utility side of the meter in parallel, and couples the output portion to an output of the distribution panel and the residential customer side of the meter in parallel.

11. The method of claim 10, wherein the housing comprises a first flange and a second flange, both flanges covered by rings.

12. The method of claim 10, wherein the housing is cylindrical.

13. The method of claim 10, wherein the interconnection meter socket adapter further comprises a set of sockets configured to make contact with the meter.

14. The method of claim 10, wherein the interconnection meter socket adapter further comprises a set of jaw blades configured to make contact with the distribution panel.

15. The method of claim 10, wherein the housing further comprises a coupler configured to accept a connector.

16. The method of claim 15, wherein the interconnection meter socket adapter further comprises a breaker coupled between the coupler and the meter.

17. The method of claim 15, wherein the connector is a flexible cable or flexible conduit containing insulated wires configured to be coupled to the energy source and the energy sink.

18. The method of claim 10, wherein the interconnection meter socket adapter further comprises a measurement module measuring bidirectional power flow through the interconnection meter socket adapter.

19. The method of claim 18, wherein the interconnection meter socket adapter further comprises a communication module coupled to the measurement module.

* * * * *